United States Patent
Koyama

(10) Patent No.: US 8,541,859 B2
(45) Date of Patent: Sep. 24, 2013

(54) SEMICONDUCTOR LIGHT RECEIVING ELEMENT AND METHOD FOR MANUFACTURING THE SAME

(75) Inventor: Yuji Koyama, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 64 days.

(21) Appl. No.: 13/307,791

(22) Filed: Nov. 30, 2011

(65) Prior Publication Data

US 2012/0133013 A1    May 31, 2012

(30) Foreign Application Priority Data

Nov. 30, 2010    (JP) ................................. 2010-267839

(51) Int. Cl.
*H01L 31/0203*    (2006.01)
(52) U.S. Cl.
USPC .................................... 257/434; 257/E31.11
(58) Field of Classification Search
USPC .......................................... 257/434, E31.11
See application file for complete search history.

(56) References Cited

U.S. PATENT DOCUMENTS

| | | | |
|---|---|---|---|
| 7,705,375 B2 * | 4/2010 | Nishijima et al. | 257/233 |
| 8,368,972 B2 * | 2/2013 | Takeda et al. | 358/480 |
| 2011/0182314 A1 * | 7/2011 | Yoshikawa et al. | 372/46.012 |
| 2012/0170084 A1 * | 7/2012 | Takeda et al. | 358/480 |

FOREIGN PATENT DOCUMENTS

JP    2006-245606 A    9/2006

* cited by examiner

*Primary Examiner* — Lex Malsawma
(74) *Attorney, Agent, or Firm* — Westerman, Hattori, Daniels & Adrian, LLP

(57) ABSTRACT

A semiconductor light receiving element includes a first semiconductor layer having a first conduction type, a second semiconductor layer that is provided on the first semiconductor layer and has a light receiving area, the second semiconductor layer having a second conduction type opposite to the first conduction type, an insulation film provided on the second semiconductor layer, and an electrode provided on the insulation film, the insulation film having a plurality of windows in an area in which the electrode overlaps the plurality of windows, the electrode being electrically connected to the second semiconductor layer via the plurality of windows.

12 Claims, 11 Drawing Sheets

CONTACT AREA [μm²]

SEMICONDUCTOR LIGHT RECEIVING ELEMENT AND METHOD FOR MANUFACTURING THE SAME

CROSS-REFERENCE TO RELATED APPLICATION

This application is based upon and claims the benefit of priority of the prior Japanese Patent Application No. 2010-267839, filed on Nov. 30, 2010, the entire contents of which are incorporated herein by reference.

BACKGROUND (i) Technical Field

A certain aspect of the embodiments discussed herein is related to a semiconductor light receiving element and a device using the same.

(ii) Related Art

Conventionally, there are known a front surface incident type of light receiving element that receives incident light from the front surface thereof, and a back surface incident type of light receiving element that receives incident light from the back surface thereof (see Japanese Patent Application Publication No. 2006-245606).

The light receiving element and a transimpedance amplifier are connected together. The transimpedance amplifier converts light current output by the light receiving element to a voltage. An impedance mismatch may occur between the light receiving element and the transimpedance amplifier. For the purpose of suppressing such an impedance mismatch, a resistor is provided between the light receiving element and the transimpedance amplifier.

SUMMARY

According to an aspect of the present invention, there is provided a semiconductor light receiving element includes a first semiconductor layer having a first conduction type, a second semiconductor layer that is provided on the first semiconductor layer and has a light receiving area, the second semiconductor layer having a second conduction type opposite to the first conduction type, an insulation film provided on the second semiconductor layer, and an electrode provided on the insulation film, the insulation film having a plurality of windows in an area in which the electrode overlaps the plurality of windows, the electrode being electrically connected to the second semiconductor layer via the plurality of windows.

DETAILED DESCRIPTION

Figure 1:
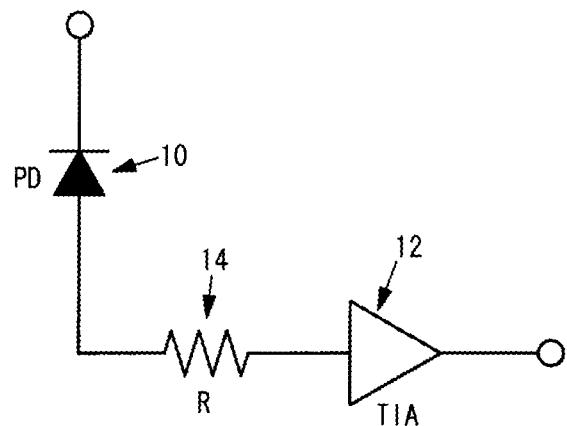
FIG. 1 is a circuit diagram of a circuit in which a light receiving element and a transimpedance amplifier are connected together via a resistor.

FIG. 1 is a circuit diagram of a circuit in which a resistor is connected between a light receiving element and a transimpedance amplifier. Referring to FIG. 1, a resistor 14 is provided between a light receiving element 10 and a transimpedance amplifier 12. With this arrangement, it is possible to suppress an impedance mismatch between the light receiving element 10 and the transimpedance amplifier 12. However, the presence of the resistor 14 increases the manufacturing cost and prevents downsizing.

Figure 2A:
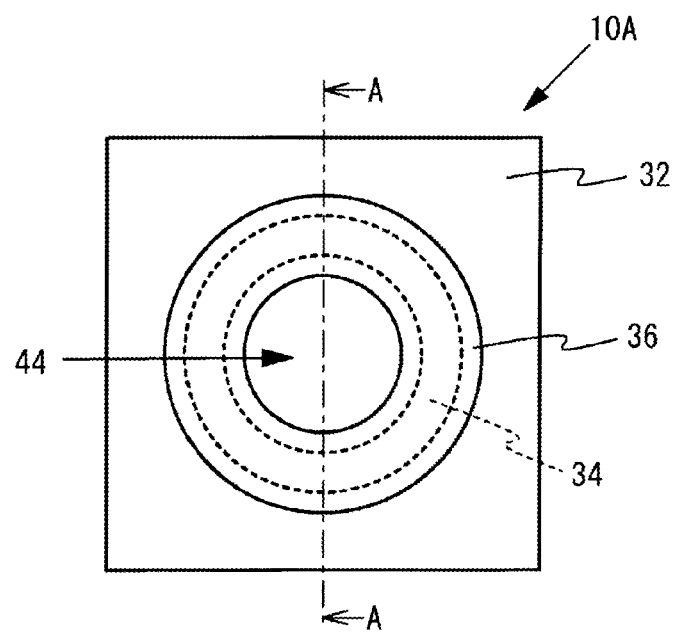
FIG. 2A is a plan view of a light receiving element in accordance with a first embodiment.
Figure 2B:
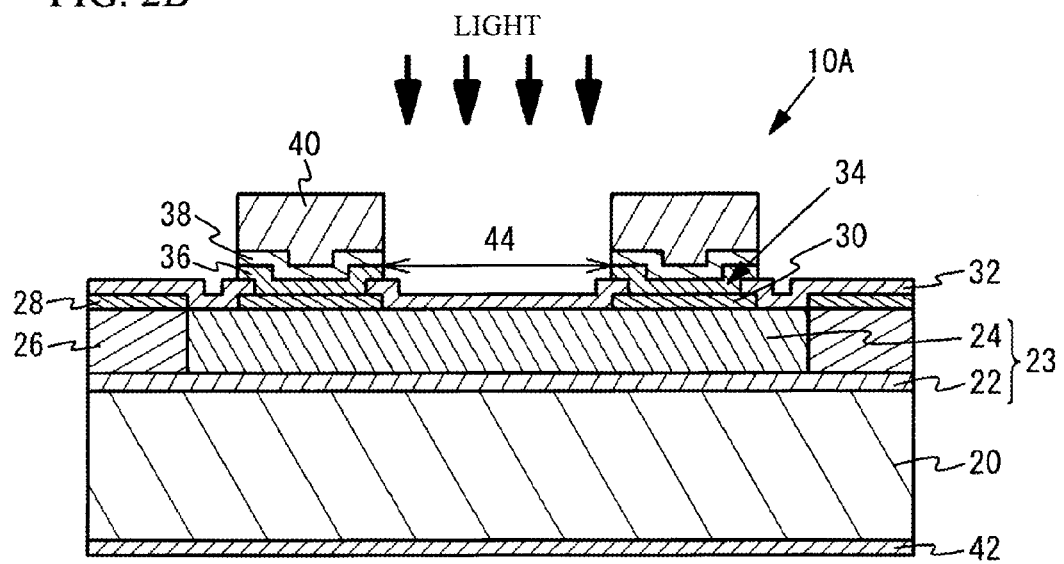
FIG. 2B is a cross-sectional view taken along a line A-A in FIG. 2A.

A first comparative example is now described. FIG. 2A is a plan view of a light receiving element 10A in accordance with the first comparative example, and FIG. 2B is a cross-sectional view taken along a line A-A in FIG. 2A. In FIG. 2A, the light receiving element 10A is illustrated so as to see through an Au sputtered film 38 and an Au plated layer 40. A similar see-through illustration will be used in FIGS. 3, 5, 7, 8, 10B, 11 and 13B. Referring to FIGS. 2A and 2B, an undoped InGaAs light absorbing layer 22 is provided on an n-type InP substrate 20. A p-type InP window layer 24 and an n-type InP window layer 26 are provided on the InGaAs light absorbing layer 22. The p-type InP window layer 24 is a diffused region formed by doping the n-type InP window layer 26 with a p-type impurity (for example, Zn, Cd or Be) while a silicon nitride film 28 formed on the n-type InP window layer 26 is used as a mask. The light receiving element 10A of the first comparative example is a PIN photodiode having a semiconductor layer 23 composed of the undoped InGaAs light absorbing layer 22 and the p-type InP window layer 24, which are stacked on the n-type InP substrate 20 in this order. The conduction type of the p-type InP window layer 24 is opposite to that of the n-type InP substrate 20.

A contact layer 30 having a ring shape is provided on the upper surface of the p-type InP window layer 24. The ring shape may be a disk shape having a hollow portion in the center thereof and may be called a doughnut shape. The contact layer 30 may be made of InGaAs. The contact layer 30 is located in a peripheral portion of the p-type InP window layer 24. A silicon nitride film 32 is provided on the p-type InP window layer 24 so as to partially cover the contact layer 30. A window 34 is formed in the silicon nitride film 32 on the contact layer 30. The window 34 is provided on the upper surface of the ring-shaped contact layer 30, and has a ring shape similar to that of the contact layer 30. The upper surface of the contact layer 30 is exposed in the window 34. A p-side electrode 36 is provided on the upper surface of the contact layer 30 in the window 34 and on the silicon nitride film 32.

The p-side electrode 36 may have a multilayer structure of Ti and Pt where Ti contacts the contact layer 30. The p-side electrode 36 has a ring shape. The contact layer 30 and the p-side electrode 36 are concentrically arranged and have an identical width. The window 34 has a width smaller than the widths of the contact layer 30 and the p-side electrode 36.

The Au sputtered film 38 is provided on the upper surface of the p-side electrode 36, and the Au plated layer 40 is provided on the Au sputtered film 38. The Au sputtered film 38 and the Au plated layer 40 have a ring shape that is concentrically arranged with the contact layer 30 and the p-side electrode 36. An n-side electrode 42 is provided on the back surface of the n-type InP substrate 20. The n-side electrode 42 may be formed by stacking AuGe, Au, Ti, Pt and Au in this order on the backside of the n-type InP substrate 20 where AuGe contacts the backside.

An inside area of the ring-shaped contact layer 30, p-side electrode 36, Au sputtered film 38 and Au plated layer 40 is a light receiving area 44, which receives incident light from the upper side of the p-type InP window layer 24. The light receiving element of the first comparative example is a front surface incident type of light receiving element.

The p-side electrode 36 is provided so as to be buried in the window 34, whereby the p-side electrode 36 contacts the contact layer 30 in the window 34 and makes an electric connection therewith. The window 34 is provided for making an electric connection between the p-side electrode 36 and the p-type window layer 24 via the contact layer 30. A zone in which the p-side electrode 36 and the contact layer 30 contact each other is defined as a contact zone, and the area of the contact zone is defined as a contact area. The window 34 defines the contact zone, and the area of the window 34 is the contact area. As illustrated in FIG. 2A, since the window 34 has a ring shape, the contact zone has a ring shape, and the area of the contact zone is the contact area.

Figure 3:
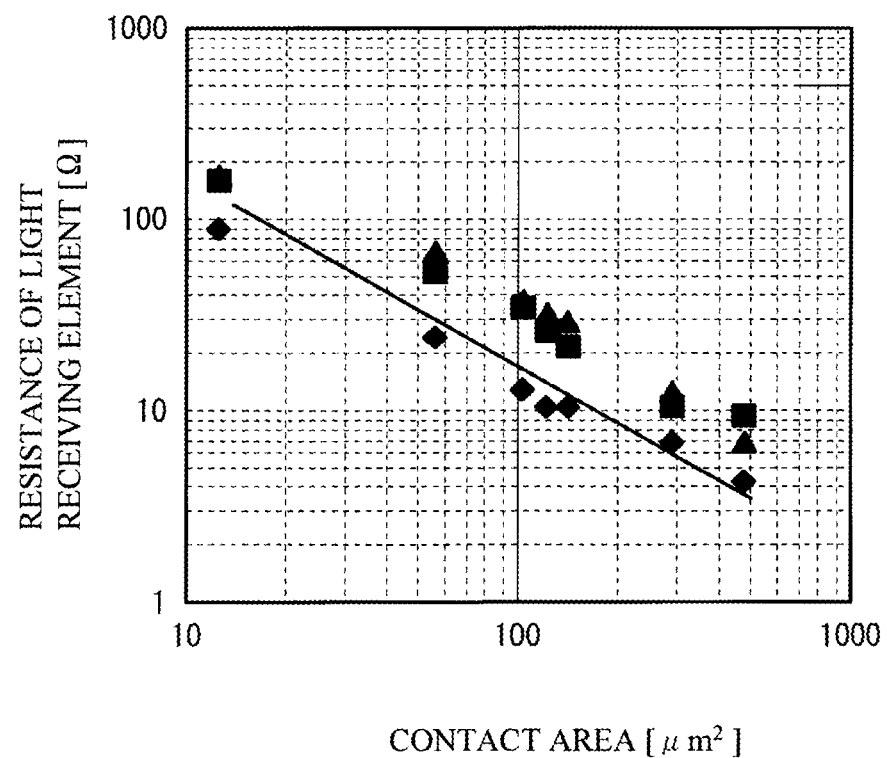
FIG. 3 illustrates measurement results of the resistance of the light receiving element associated with the contact area.

The inventor studied a correlation between the contact area and the resistance of the light receiving element. In the study, a plurality of light receiving elements having different contact areas were formed on a wafer, and the resistance of each light receiving element was measured. FIG. 3 is a graph of measurement results in which the vertical axis is the contact area and the horizontal axis is the resistance of each light receiving element. In the study, three wafers similarly processed were used, the resistance of each element of each wafer was measured. FIG. 3 illustrates measurement results of the three wafers. As illustrated in FIG. 3, the resistances of the light receiving elements are inversely proportional to the contact area, and become lower as the contact area becomes larger. It can be seen from the measurement results that the resistance of the light receiving element can be controlled by controlling the size of the contact area.

Figure 4:
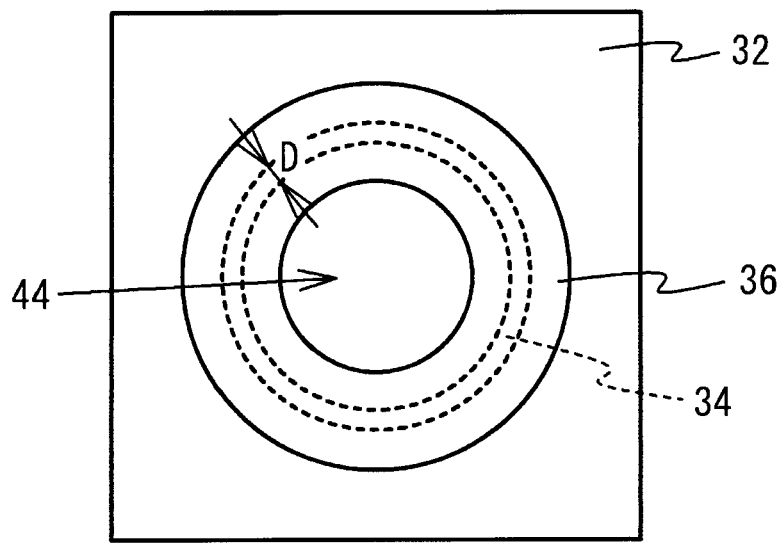
FIG. 4 is a plan view of a light receiving element in which the width of the window is reduced.

A reduction in the contact area may be achieved by narrowing the width D of the ring-shaped window 34, as illustrated in FIG. 4. It is to be noted that the window 34 is formed by forming a patterned photoresist on the silicon nitride film 32 and etching the silicon nitride film 32 with the photoresist being a mask. Thus, the limit on the manufacturing process such as the formable pattern width defines the minimum value of the width D of the window 34. As a result, a reduction in the width D of the ring-shaped window 34 has a difficulty in achieving a sufficient small contact area and realizing a desired resistance of the light receiving element. Light receiving elements of embodiments described below are capable of realizing a desired resistance of the light receiving element.

First Embodiment

A light receiving element of a first embodiment is an exemplary PIN type photodiode of a front surface incident type.

Figure 5:
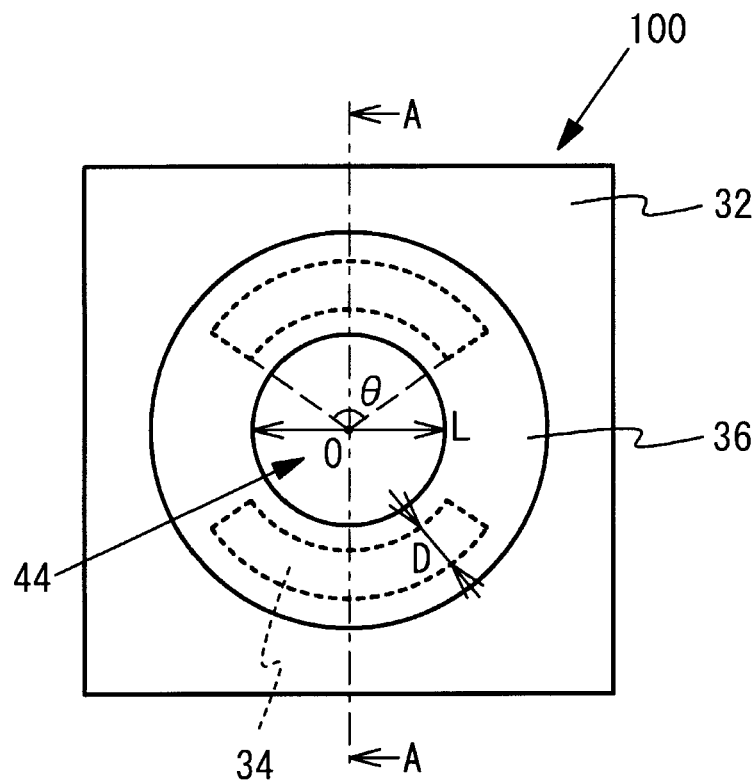
FIG. 5 is a plan view of a light receiving element in accordance with a first embodiment.

FIG. 5 is a plan view of a light receiving element 100 in accordance with the first embodiment. A cross section taken along a line A-A in FIG. 5 is the same as that the first comparative example illustrated in FIG. 2B, and is not illustrated here.

Referring to FIG. 5, the light receiving element 100 has two separate windows 34 formed along the ring-shaped contact layer 30. That is, the two windows 34 are arranged so as to be separate portions of a ring shape. The windows 34 are arranged so as to circularly surround the light receiving area 44. The widths D of the windows 34 may be 3.0 µm, for example. An angle θ of each of the windows 34 with respect to the center O of the contact layer 30 is 90°, for example. The light receiving area 44 has a diameter L of, for example, 50 µm. The two windows 34 are symmetrical about the center O, and are circularly spaced apart from each other at constant intervals.

In the light receiving element of the first embodiment, the ring-shaped contact layer 30 is provided on the semiconductor layer 23 composed of the InGaAs light absorbing layer 22 and the p-type InP window layer 24 on the n-type InP substrate 20. The two separate windows 34 for contacting the contact layer 30 and the p-side electrode 36 are formed in the silicon nitride film 32. The p-side electrode 36 electrically connected to the contact layer 30 is provided on the silicon nitride film 32. The light receiving element of the first embodiment has the n-type InP substrate 20, and the p-type InP window layer 24 that is provided on the n-type InP substrate 20 and has the conduction type opposite to that of the n-type InP substrate 20. The inner portion of the p-type InP window layer 24 is the light receiving area. The two windows 34 for making electric connections between the p-side electrode 36 and the p-type InP window layer 24 are formed in the silicon nitride film 32 so as to be located in positions in which the p-side electrode 36 on the silicon nitride film 32 overlaps the two windows 34. The use of the two separate windows 34 makes it possible to reduce the contact area between the contact layer 30 and the p-side electrode 36 while the widths D of the windows 34 are kept equal to the width of the ring-shaped window 34 illustrated in FIG. 2A. That is, the widths D of the windows 34 of the first embodiment are immune to the limit on the process of forming the ring-shaped window 34 in FIG. 2A. It is thus possible to realize a smaller contact area than that formed by narrowing the width D of the ring-shaped window 34 to the limit on the manufacturing process. It is further possible to control the resistance of the light receiving element more widely and to easily realize a desired resistance.

Figure 6A:
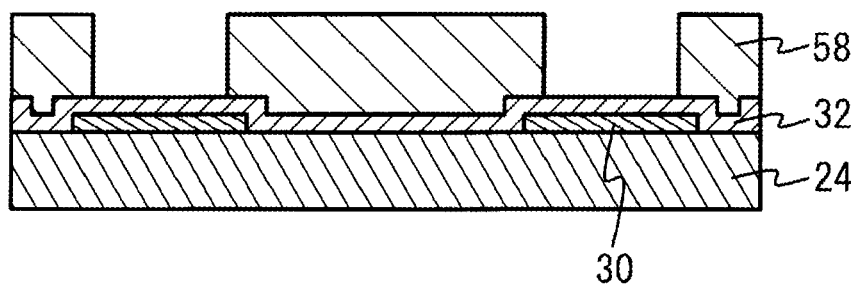
FIGS. 6A through 6C are cross-sectional views that illustrate a process for forming windows.
Figure 6B:
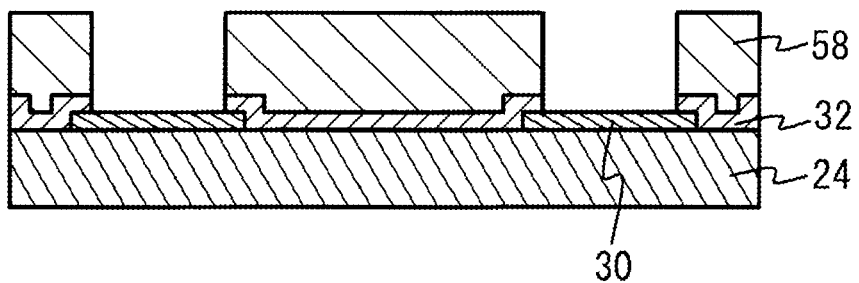
Figure 6C:
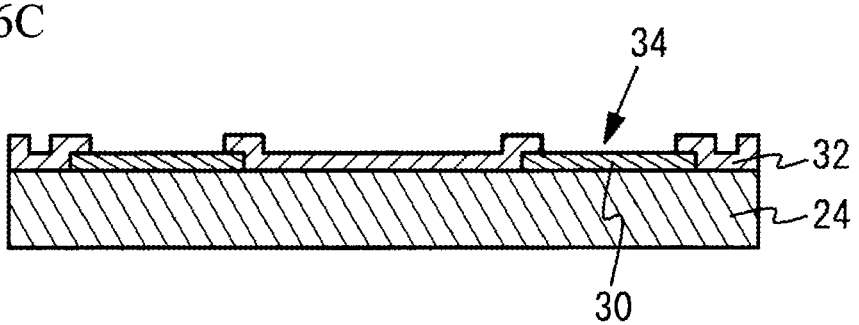

As has been described in connection with the first comparative example, the windows 34 are formed by etching. FIGS. 6A through 6C are cross-sectional views that illustrate a process for forming the windows 34. Referring to FIG. 6A, a photoresist 58 having openings corresponding to the areas in which the windows 34 should be formed are formed on the silicon nitride film 32 formed so as to cover the contact layer 30. As illustrated in FIG. 3, the resistance of the light receiving element and the contact area has a correlation. The use of the correlation makes it possible to obtain a specific contact area that realizes a desired resistance of the light receiving element and define the opening area of the photoresist 58 based on the specific contact area.

As illustrated in FIG. 6B, the silicon nitride film 32 is etched by a dry or wet etching process that uses the photoresist 58 as a mask. Then, as illustrated in FIG. 6C, the photoresist 58 is removed. Thus, the windows 34 having a desired size are formed in the silicon nitride film 32, and a desired resistance of the light receiving element is realized.

The light receiving element of the first embodiment is of a front surface incident type in which the inside region of the ring shaped contact layer 30 is the light receiving area 44 that receives incident light from the upper side of the p-type InP window layer 24, and the windows 34 are located further out than the light receiving area 44. The windows 34 are arranged so as to circularly surround the light receiving area 44. It is thus possible to suppress degradation of the light absorbing efficiency of the InGaAs light receiving layer 22.

Figure 7:
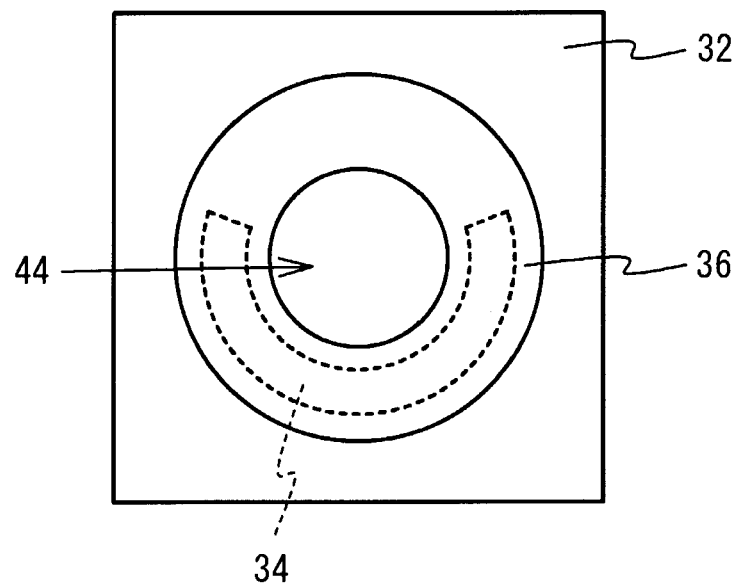
FIG. 7 is a plan view of a light receiving element in accordance with a first variation of the first embodiment.

FIG. 7 illustrates a first variation of the first embodiment, which variation is capable of considerably reducing the contact area and realizing a desired resistance of the light receiving element. The window 34 in FIG. 7 is shaped as if a portion of the ring-shaped window 34 used in the first comparative example is removed. It is generally said that the window 34 is formed by removing a portion of a loop. The window 34 in FIG. 7 is formed in the silicon nitride film 32 in the area in which the p-side electrode 36 overlaps the silicon nitride film 32 so as to circularly surround the light receiving area 44, and is partly removed. The removed portion of the window 34 has no window in the silicon nitride film 32. However, the first embodiment may be more preferable than the first variation thereof. The multiple separate windows 34 arranged so as to have a constant spacing in the circular direction make it possible to realize a more uniform distribution of the electric field applied to the InGaAs light absorbing layer 22 since the p-side electrode 36 contacts the contact layer 30 in the windows 34.

Figure 8:
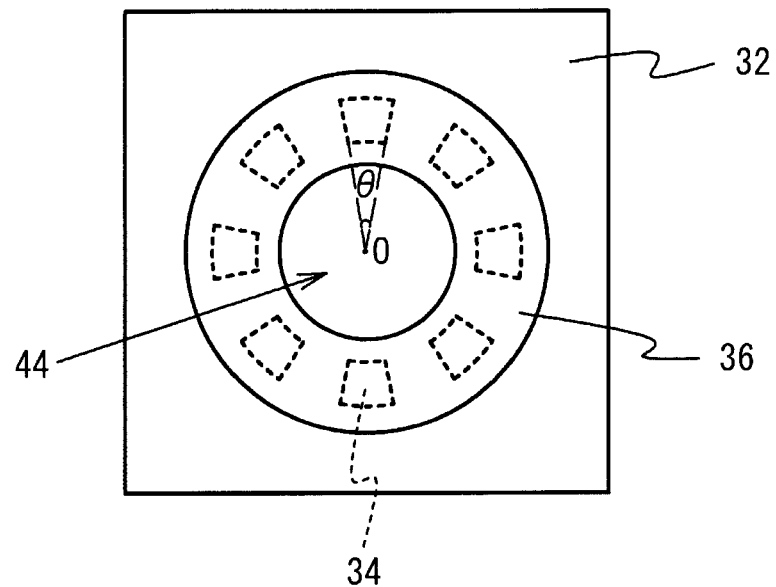
FIG. 8 is a plan view of a light receiving element in accordance with a second variation of the first embodiment.

The first embodiment illustrated in FIG. 5 has two windows 34. However, more than two separate windows may be employed. FIG. 8 illustrates a second variation of the first embodiment in which the ring shaped window 34 used in the first comparative example is divided into eight separate windows. Referring to FIG. 8, eight windows 34 are evenly spaced apart from each other and are arranged circularly. The angle θ of each window 34 with respect to the center O is 20°, for example. The arrangement of the eight windows 34 makes it possible to considerably reduce the contact area and realize a desired resistance of the light receiving element. Further, the distribution of the electric field applied to the InGaAs light absorbing layer 22 may be made more uniform than the arrangement of the two windows 34 illustrated in FIG. 5. The more the windows 34, the more uniform the electric field. For example, the number of windows 34 is preferably four, more preferably six and much more preferably eight. An odd number of windows 34 may be used.

The windows 34 are not limited to the fan-shaped windows but may be circular, ellipse, rectangular or square shapes.

The contact layer 30 may be omitted so that the p-side electrode 36 contacts the p-type InP window layer 24.

The silicon nitride film 32 may be replaced with another insulation film that is transparent to incident light from the upper side of the p-type InP window layer 24 and is an antireflection film.

The light receiving element of the first embodiment is not limited to the PIN photodiode but may be another type of photodiode such as an avalanche photodiode or a PN junction photodiode. The conduction types of the photodiodes may be inverted.

Second Embodiment

Figure 9:
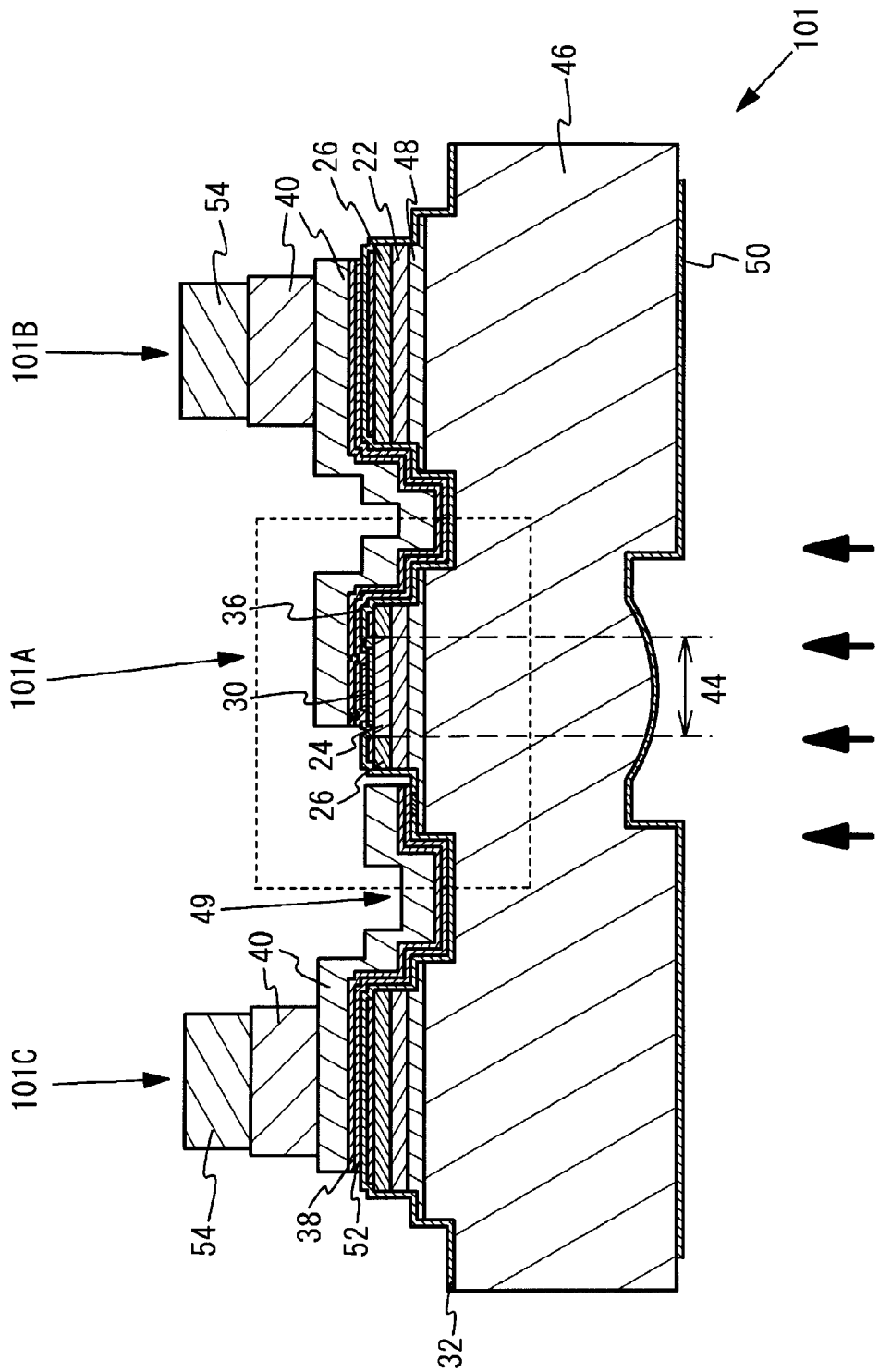
FIG. 9 is a cross-sectional view of a light receiving element in accordance with a second embodiment.
Figure 10A:
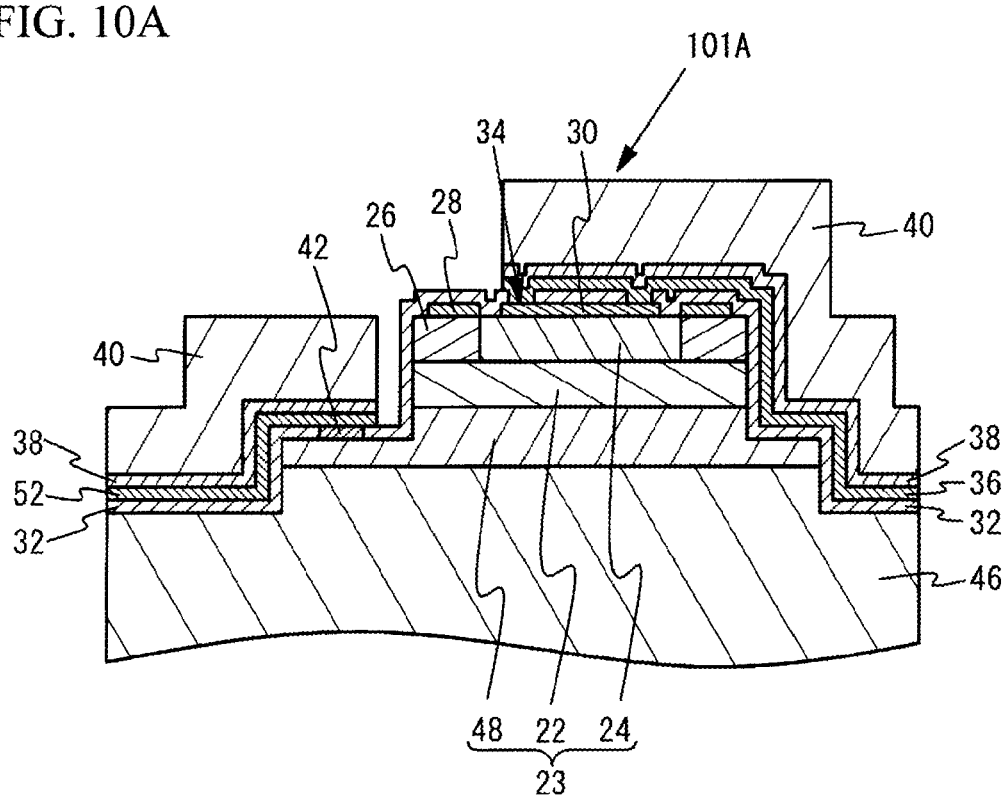
FIG. 10A is an enlarged cross-sectional view of a portion indicated by a broken line in FIG. 9.
Figure 10B:
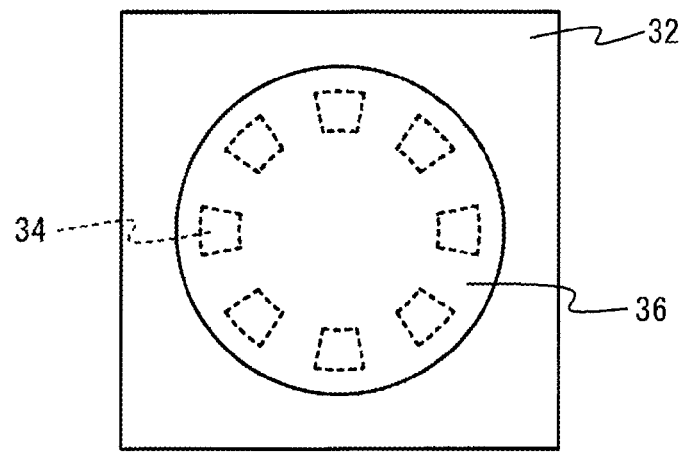
FIG. 10B is a plan view thereof.

A light receiving element 101 of a second embodiment is an exemplary back surface incident type PIN photodiode. FIG. 9 is a cross-sectional view of the light receiving element 101. FIG. 10A is an enlarged cross-sectional view of a portion identified by a broken line in FIG. 9, and FIG. 10B is a plan view of the portion. In FIG. 10B, only a part of the p-side electrode 36 provided on the upper surface of the contact layer 30 is illustrated for the sake of simplicity. A similar illustration will be used in FIGS. 11 and 13B. Referring to FIGS. 9 and 10A, an n-type InP contact layer 48 is provided on a semi-insulation InP substrate 46, and the undoped InGaAs light absorbing layer 22 is provided on the re-type InP contact layer 48. The p-type InP window layer 24 and the n-type InP window layer 26 are provided on the InGaAs light absorbing layer 22. The p-type InP window layer 24 is a diffused region formed by doping the n-type InP window layer 26 with a p-type impurity by using, as a mask, the silicon nitride film 28 on the n-type InP window layer 26. The light receiving element 101 of the second embodiment is a PIN photodiode having a mesa shape including a semiconductor layer 23 composed of the n-type InP contact layer 48, the undoped InGaAs light absorbing layer 22 and the p-type InP window layer 24, which layers are stacked in this order on the semi-insulation InP substrate 46. More particularly, the light receiving element 101 has a light receiving portion 101a having a mesa shape, and dummy mesas 101B and 101C.

A groove 49 is formed between the light receiving portion 101A and the dummy mesa 101B and between the light receiving portion 101A and the dummy mesa 101C. The groove 49 reaches the semi-insulation InP substrate 46 from the n-type InP window layer 26. The groove 49 suppresses the capacitance between the light receiving portion 101A and the dummy mesa 101B and that between the light receiving portion 101A and the dummy mesa 101C, and suppresses leakage current flowing through the n-type InP contact layer 48. A silicon nitride film 50 is provided on the back surface of the semi-insulation InP substrate 46 as an antireflection film.

The contact layer 30 having a disk shape is provided so as to cover almost all of the upper surfaced of the p-type InP window layer 24. The contact layer 30 is made of, for example, InGaAs. The silicon nitride film 32 is provided to cover the contact layer 30, and windows 34 are formed in the silicon nitride film 32 so that the upper surface of the contact layer 30 is exposed in the windows 34. As illustrated in FIG. 10B, the windows 34 may be the same as those illustrated in FIG. 10B in which the eight windows 34 are arranged in a circular manner. The windows 34 are located in the peripheral portion of the contact layer 30, that is, the peripheral portion of the p-type InP window layer 24.

The p-side electrode 36 is formed on the silicon nitride film 32 so as to be buried in the windows 34. The p-side electrode 36 is extracted to one side of the element (the right-hand side in FIG. 10A) along the inner wall of the groove 49. The p-side electrode 36 is provided on the whole upper surface of the contact layer 30, and has a disk shape that is concentric with the contact layer 30. The p-side electrode 36 may have a multilayer structure of Ti and Pt where Ti contacts the contact layer 30. The silicon nitride film 32 is provided on the inner wall of the groove 49, and electrically isolates the p-side electrode 36 and the n-type InP contact layer 48 from each other. The Au sputtered film 38 and the Au plated layer 40 are stacked in this order on the p-side electrode 36.

In the groove 49, a part of the silicon nitride film 32 on the n-type InP contact layer 48 has an opening located on the side of the mesa 101A opposite to the side on which the p-side electrode 36 is extracted. The n-side electrode 42 formed by stacking AuGe and Au in this order from the substrate side is provided in the opening formed in the silicon nitride film 32 so as to contact the n-type InP contact layer 48. A lead electrode 52 connected to the n-side electrode 42 is provided on the silicon nitride film 32 provided on the inner wall of the groove 49. The lead electrode 52 has a multilayer structure formed by stacking Ti and Pt in this order from the substrate side. The Au sputtered film 38 and the Au plated layer 40 are formed on the lead electrode 52 in this order.

A solder layer 54 is provided on the Au plated layer 40 and is electrically connected to the p-side electrode 36. Another solder layer 54 is provided on the Au plated layer 40 and is electrically connected to the n-side electrode 42. The solder layers 54 may be made of AuSn solder. The light receiving element of the second embodiment is flip-chip mounted on a circuit board so that the solder layers 54 are connected to circuits on the circuit board. In other words, the light receiving element is facedown mounted to the circuit board.

The light receiving element of the second embodiment is a back surface incident type of light receiving element in which incident light from the backside of the semi-insulation InP substrate 46 is absorbed by the InGaAs light absorbing layer 22. The light receiving area 44 that receives the incident light is formed by stacking the n-type InP contact layer 48, the InGaAs light absorbing layer 22 and the p-type InP window layer 24.

Since the light receiving element 101 is of the back surface incident type, the contact layer 30 is not required to have a ring shape but has a disk shape. As illustrated in FIG. 10B, the windows 34 for contacting the p-side electrode 36 with the contact layer 30 are circularly arranged at intervals in the peripheral portion of the light receiving area 44 or on the peripheral portion of the p-type InP window layer 24. That is, the windows 34 evenly spaced apart from each other may be applied to the contact layer 30 having a disk shape, whereby the contact area can be reduced considerably and the resistance of the light receiving element may be set to a desired value. The windows 34 are not located in the center portion of the light receiving area 44.

In the case where the contact layer 30 has a disk shape, the contact area may be reduced considerably by forming a single small window 34 in the center of the disk. However, in this case, the distribution of the electric field applied to the InGaAs light absorbing layer 22 may be uneven. In contrast, the arrangement of the windows 34 illustrated in FIG. 10B realizes the uniform distribution of the electric field applied to the InGaAs light absorbing layer 22. A further window 34 may be additionally provided in the center of the disk-shaped contact layer 30 in order to realize a more uniform distribution of the electric field.

Figure 11:
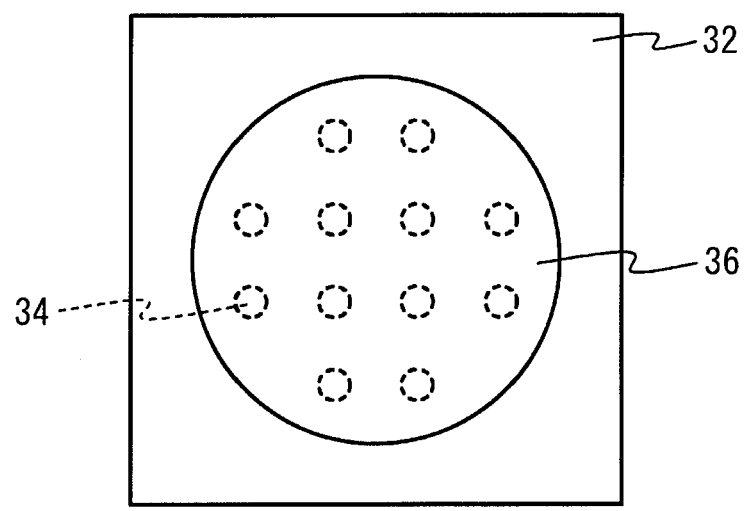
FIG. 11 is a diagram of windows located at lattice points.

In the case where the contact layer 30 has a disk shape, the windows 34 may be arranged at lattice points, as illustrated in FIG. 11, which illustrates a first variation of the second embodiment. In FIG. 11, the windows 34 are arranged in the whole light receiving area 44 in a matrix. With this arrangement, it is possible to reduce the contact area and realize a desired resistance of the light receiving element. The windows 34 may be arranged at constant intervals, whereby the electric field may be applied to the InGaAs light absorbing layer 22 uniformly. The shape of the windows 34 is not limited to a circle but may be an ellipse, rectangle or square.

The silicon nitride film 50 may be replaced with another insulation film that is transparent to incident light from the backside of the semi-insulation InP substrate 46 and is an antireflection film.

Third Embodiment

Figure 12:
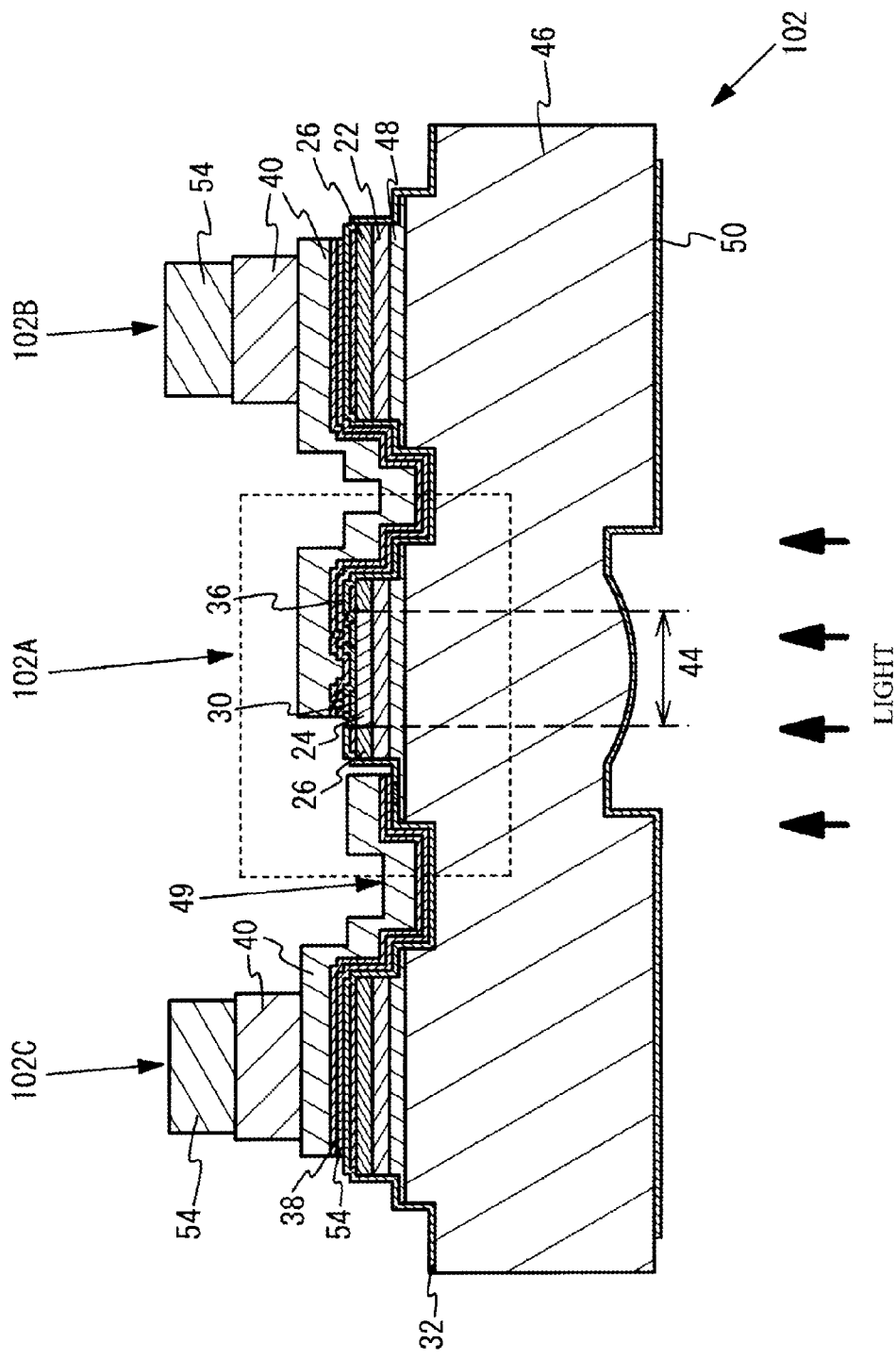
FIG. 12 is a cross-sectional view of a light receiving element in accordance with a third embodiment.
Figure 13A:
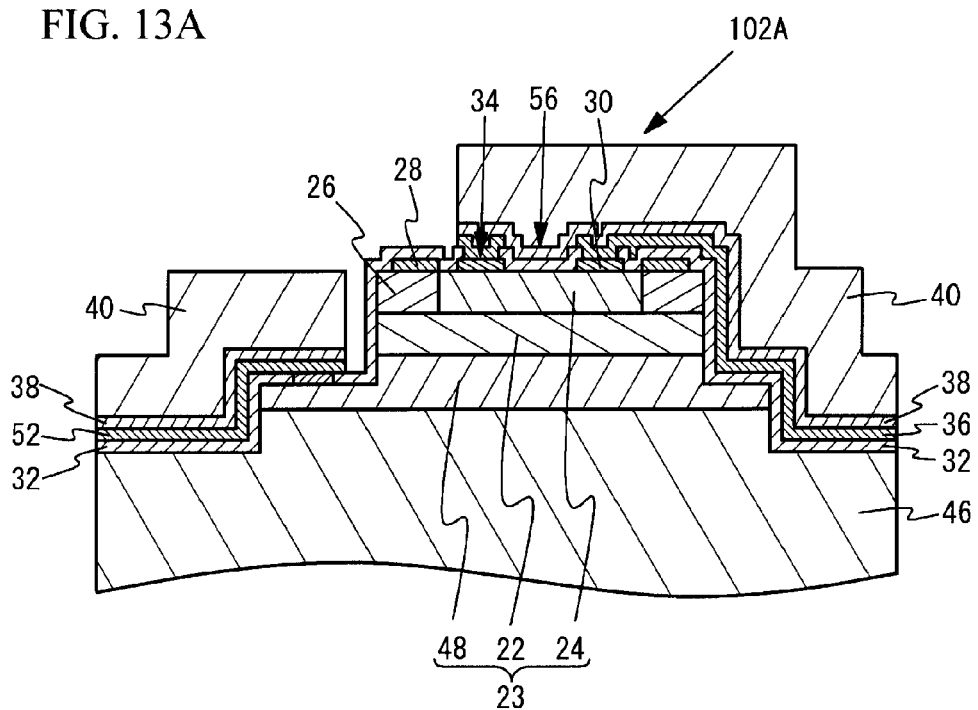
FIG. 13A is a cross-sectional view of a portion illustrated by a broken line in FIG. 12.
Figure 13B:
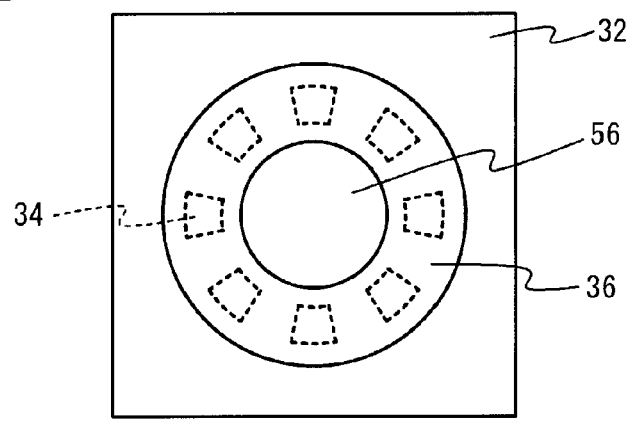
FIG. 13B is a plan view thereof.

A light receiving element 102 of a third embodiment is also a back surface incident type of PIN photodiode. FIG. 12 is a cross-sectional view of the PIN photodiode of the third embodiment. FIG. 13A is an enlarged cross-sectional view of a portion indicated by a broken line in FIG. 12, and FIG. 13B is a plan view of this portion. Referring to FIGS. 12 and 13A, the third embodiment differs from the second embodiment in the following. The contact layer 30 and the p-side electrode 36 have ring shapes. The silicon nitride film 32, the Au sputtered film 38 and the Au plated layer 40 are stacked in the inside areas of the ring shapes. The other structures of the third embodiment are the same as those of the second embodiment.

The InGaAs light absorbing layer 22 absorbs incident light from the backside of the semi-insulation InP substrate 46. All of the incident light may not be absorbed by the InGaAs light absorbing layer 22, but some light may pass through the InGaAs light absorbing layer 22. The passing light reaches a stacked layer composed of the silicon nitride film 32 and the Au sputtered film 38 in the inside area of the ring-shaped contact layer 30. The above stacked layer functions as a reflection film 56 that reflects the light passing through the InGaAs light absorbing layer 22. Thus, the passing light is reflected and travels towards the InGaAs light absorbing layer 22, which absorbs the reflected light. The light receiving element 101 of the second embodiment is configured to have the disk-shaped InGaAs contact layer 30 on the upper surface of the p-type InP window layer 24. Light passing through the InGaAs light absorbing layer 22 is not reflected by the contact layer 30 but is absorbed therein. Thus, the light receiving element 101 does not have the function of absorbing the reflected light in the InGaAs light absorbing layer 22. The third embodiment has a higher light absorbing efficiency than the second embodiment.

As illustrated in FIGS. 13A and 13B, the windows 34 are formed further out than the reflection film 56 formed in the inside area of the ring-shaped contact layer 30 and are circularly arranged in the peripheral portion of the light receiving area 44. This arrangement can prevent the light passing through the InGaAs light absorbing layer 22 from being reflected and improves the light absorbing efficiency.

As illustrated in FIG. 13B, eight separate windows 34 are circularly arranged, whereby the contact area can be reduced and a desired resistance of the light receiving element can be obtained. The eight separate windows 34 are circularly spaced apart from each other at constant intervals, whereby the electric field can be uniformly applied to the InGaAs light absorbing layer 22.

The reflection film 56 is not limited to the stacked layer composed of the silicon nitride film 32 and the Au sputtered film 38 but may be another layer composed of a metal, an insulator and/or a combination of a metal and an insulator as long as this layer has the function of reflecting incident light from the backside of the semi-insulation InP substrate 46. As illustrated in FIG. 12, the PIN photodiode 102 has a mesa-shaped light receiving portion 102A and dummy mesas 102B and 102C.

Fourth Embodiment

Figure 14A:
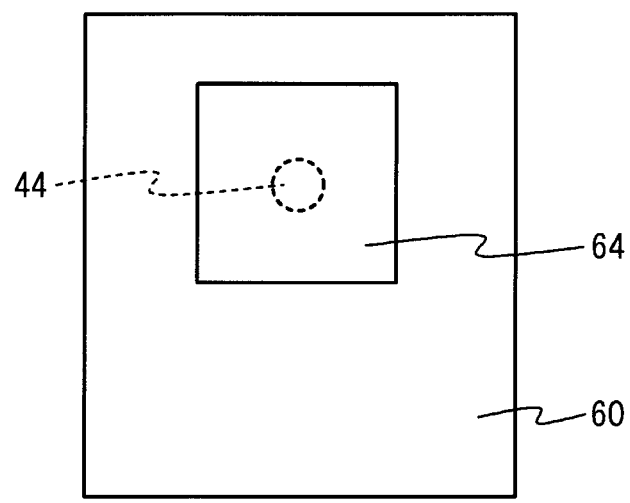
FIG. 14A is a plan view of a light receiving device in accordance with a fourth embodiment.
Figure 14B:
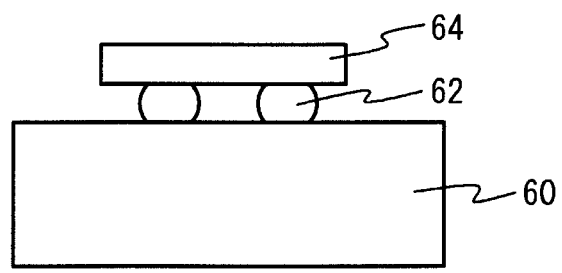
FIG. 14B is a side view thereof.

A fourth embodiment is an exemplary light receiving device in which the light receiving element of any of the first through third embodiments is mounted on a circuit board on which a transimpedance amplifier is formed. FIG. 14A is a plan view of a light receiving device of the fourth embodiment, and FIG. 14B is a side view thereof. Referring to FIGS. 14A and 14B, a light receiving element 64, which is any of the first through third embodiments, is mounted on a circuit board 60 on which a transimpedance amplifier is formed by using Au bumps 62. The light receiving element of the first embodiment is face-up mounted, and that of either the second or third embodiment is facedown mounted. The light receiving element 64 and the transimpedance amplifier are electrically connected together.

The light receiving element of any of the first through third embodiments is capable of reducing the contact area and realizing a desired resistance of the light receiving element. Thus, the light receiving device of the fourth embodiment is capable of suppressing impedance mismatch between the light receiving element and the transimpedance amplifier without using an external component such as a resistor between the light receiving element and the transimpedance amplifier. Therefore, the light receiving device is less expensive and is compact.

The present invention is not limited to the specifically described embodiments but may include other embodiments and variations without departing from the scope of the claimed invention.

What is claimed is:

1. A semiconductor light receiving element comprising:
   a first semiconductor layer having a first conduction type;
   a second semiconductor layer that is provided on the first semiconductor layer and has a light receiving area, the second semiconductor layer having a second conduction type opposite to the first conduction type;
   an insulation film provided on the second semiconductor layer; and
   an electrode provided on the insulation film,
   the insulation film having a plurality of windows in an area in which the electrode overlaps the plurality of windows, the electrode being electrically connected to the second semiconductor layer via the plurality of windows.

2. The semiconductor light receiving element according to claim 1, wherein the plurality of windows are arranged in a peripheral portion of the light receiving area and are not arranged in a center portion thereof.

3. The semiconductor light receiving element according to claim 1, wherein the plurality of windows are arranged in a peripheral portion of the light receiving area and in a center portion thereof.

4. The semiconductor light receiving element according to claim 3, wherein light is incident to the light receiving area through the first semiconductor layer.

5. The semiconductor light receiving element according to claim 1, wherein the plurality of windows are spaced apart from each other at constant intervals.

6. The semiconductor light receiving element according to claim 1, further comprising a contact layer between the second semiconductor layer and the insulation film.

7. The semiconductor light receiving element according to claim 6, wherein the contact layer is made of InGaAs.

8. The semiconductor light receiving element according to claim 1, wherein the semiconductor light receiving element has a flip-chip structure.

9. A semiconductor light receiving element comprising:
   a first semiconductor layer having a first conduction type;
   a second semiconductor layer that is provided on the first semiconductor layer and has a light receiving area, the second semiconductor layer having a second conduction type opposite to the first conduction type;
   an insulation film provided on the second semiconductor layer; and
   an electrode provided on the insulation film,
   the insulation film having a window in an area in which the electrode overlaps the window, the electrode being electrically connected to the second semiconductor layer in the window,
   the window having a shape formed by removing a portion of a closed loop.

10. The semiconductor light receiving element according to claim 9, further comprising a contact layer between the second semiconductor layer and the insulation film.

11. The semiconductor light receiving element according to claim 10, wherein the contact layer is made of InGaAs.

12. The semiconductor light receiving element according to claim 9, wherein the semiconductor light receiving element has a flip-chip structure.

* * * * *